United States Patent [19]

Soos

[11] 4,163,072
[45] Jul. 31, 1979

[54] ENCAPSULATION OF CIRCUITS

[75] Inventor: Nicholas A. Soos, Macungie, Pa.

[73] Assignee: Bell Telephone Laboratories, Incorporated, Murray Hill, N.J.

[21] Appl. No.: 804,439

[22] Filed: Jun. 7, 1977

[51] Int. Cl.² .................. H01L 23/30; B05D 1/38
[52] U.S. Cl. .................................... 427/96; 427/377;
427/379; 427/282; 427/386; 427/387; 427/407 R; 427/420; 357/72
[58] Field of Search .................... 427/82, 93, 379, 96, 427/407 R, 413, 386, 387, 261, 282, 420, 377; 357/72

[56] References Cited
U.S. PATENT DOCUMENTS

| 3,254,282 | 5/1966 | West | 357/72 |
| 3,429,981 | 2/1969 | Shallahamer | 174/52 PE |
| 3,441,813 | 4/1969 | Takatsuka | 357/72 |
| 3,496,427 | 2/1970 | Lee | 357/72 |
| 3,566,208 | 2/1971 | Wang | 357/72 |
| 3,762,939 | 10/1973 | Hunter | 427/379 |
| 3,778,685 | 12/1973 | Kennedy | 357/72 |
| 3,821,611 | 1/1974 | Bacher | 427/96 |
| 3,911,178 | 10/1975 | McDowell | 427/379 |
| 3,946,427 | 3/1976 | Iwasawa | 357/72 |
| 4,017,495 | 4/1977 | Jaffe | 264/272 |

FOREIGN PATENT DOCUMENTS 5030676 2/1975 Japan ......................... 357/72

Primary Examiner—Michael F. Esposito
Attorney, Agent, or Firm—Lester H. Birnbaum

[57] ABSTRACT

Disclosed is a technique for the protection of microelectronic circuits. A room temperature vulcanizing silicone rubber is applied over the circuit. While the rubber is in an uncured state, a solvent-resistant cover coating is applied thereon. The resulting structure is then treated so that both layers cure simultaneously. The resulting dual layer provides protection against contaminants and solvents used in the circuit fabrication. In addition, mechanical protection is provided for crossovers and circuit chips.

13 Claims, 1 Drawing Figure

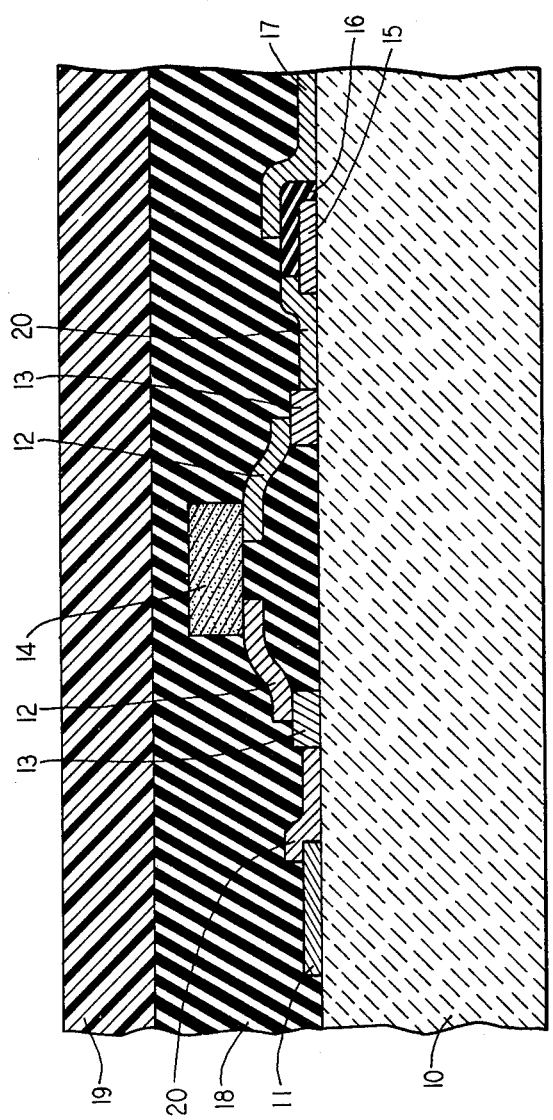

ENCAPSULATION OF CIRCUITS

BACKGROUND OF THE INVENTION

This invention relates to circuit fabrication, and in particular to a method of providing chemical and mechanical protection of circuit components.

Micro-electronic circuits, such as thin film and hybrid integrated circuits, have found increasing use in sophisticated systems where it is necessary to assemble the circuits on printed wiring boards by various soldering techniques. The need for precision and dependability of such circuitry has necessitated an effort to provide the greatest possible protection of circuit components from contaminants in the atmosphere as well as from solvents used in cleaning the printed wiring boards after assembly.

It has been found that room temperature vulcanizing (RTV) silicone rubber encapsulants provide good protection against moisture, particulate matter and in some cases light. However, such encapsulants provide little resistance to solvents and other chemicl solutions typically used to deflux the printed wiring boards after the soldering operations. Thus, if the circuit is exposed to such liquid solvents and chemicals for more than one minute, it was found that the encapsulant could be penetrated causing damage to silicon integrated circuit chips and crossovers. In addition, the encapsulant does not provide sufficient mechanical and handling protection for delicate circuit components. In most cases, either a plastic housing or a metal cover is therefore desirable for mechanical protection. Although the housings and covers achieve this function, they provide no protection against the solvents and chemicals which penetrate the encapsulant.

Many prior art schemes exist for providing a second layer over the encapsulating layer to enhance the protection of circuit components. (See, for example, U.S. Pat. No. 3,441,813 issued to Takatsuka, and U.S. Pat. No. 3,566,208 issued to Wang.) It has been found, however, that when conventional teaching was followed, the second layer would not adhere well to the encapsulant. Thus, the cover coat would easily separate from the encapsulant when a slight lifting force was applied or when the circuit was subjected to thermal cycling.

It is therefore an object of the invention to provide enhanced chemical and mechanical protection for circuit components.

It is a further object of the invention to provide such protection with a dual layer of encapsulant and cover coating which adhere strongly to one another.

SUMMARY OF THE INVENTION

These and other objects are achieved in accordance with the invention. An RTV silicone rubber encapsulant is applied to the circuit. If any solvent is present, it is allowed to evaporate without curing the encapsulant. The cover coating, which can be, for example, polyurethane or epoxy, is applied over the uncured encapsulant. The resulting structure is then treated so that the two layers are cured together.

BRIEF DESCRIPTION OF THE DRAWING

These and other features of the invention are delineated in detail in the following description.

In the drawing:

The FIGURE is a cross-sectional view of a portion of a circuit fabricated in accordance with one embodiment of the invention.

It should be understood that this figure is not drawn to scale.

DETAILED DESCRIPTION

The invention will be described with reference to the fabrication of a typical hybrid integrated circuit, a portion of which is shown in the FIGURE. It will be understood that the circuit would include many more elements. In addition, it will be realized that the invention could be applicable to any micro-electronic circuit or circuit component where maximum protection is desired.

The circuit shown in FIG. 1 is fabricated on a substrate, 10, which is typically a ceramic. The circuit includes a thin film resistor, 11, typically comprising tantalum nitride. A capacitor is also shown which comprises a tantalum electrode, 15, a tantalum oxide dielectric, 16, and a nichrome-gold counter electrode 17. A silicon integrated circuit chip, 14, is shown bonded to bonding pads 13 by means of beam leads 12. The elements are connected by interconnect metal 20 which is usually a Ti-Pd-Au multilayer.

In accordance with the invention, a room temperature vulcanizing silicone rubber, 18, is applied over the circuit. Such an encapsulant comprises as a basic ingredient a siloxane polymer with a variety of active end groups for cross-linking upon exposure to moisture. In this embodiment, the material comprised a dimethyl siloxane polymer with methoxy end groups dissolved in xylene to form a dispersion of approximately 51% solids and 49% solvent. Such a material is sold by Dow Corning under the designation DC3-6550. It should be clear, however, that the present invention contemplates use of any silicone rubber encapsulant which cures by reaction with moisture.

The use of a dispersion permitted the application of the encapsulant by standard flow-coating techniques. This involves generally providing the encapsulant in a dispenser under controlled pressure and discharging the material so that it flows over essentially the entire circuit. The thickness of the encapsulating layer was approximately 45 mils as applied, but a preferred range would appear to be approximately 30–55 mils.

In cases where a dispersion is utilized, the next step is to evaporate the solvent without curing the encapsulant. This can be done most effectively in one of two ways, depending upon the type of cover coating used. In accordance with one embodiment of the invention, immediately after the encapsulant was applied, the circuit was placed in a chamber with a dry ambient having a relative humidity of 5% or less. Preferably, the ambient is dry nitrogen with a flow rate adjusted to evaporate the solvent in at least three hours. This technique is employed to evaporate the solvent without curing the encapsulant and insure full coverage of the encapsulant in the gap between the circuit chips and substrate. In a particular example, the chamber measured approximately 2 ft×2 ft×4 inches, the circuit measured approximately 1.25×0.50 inches, and a flow rate of approximately 5 liters/min of nitrogen with a relative humidity of approximately 0.25% completely evaporated the solvent after approximately five hours. (Such a pre-cure treatment is described in detail in U.S. patent application of Jaffee and Soos, Ser. No. 625,315, filed Oct. 23, 1975 and allowed Nov. 26, 1976, now U.S. Pat.

No. 4,017,495 (which is incorporated by reference herein.) This technique was effective in the cases of all cover coatings employed.

In the case of an epoxy cover coating, it was found that this dry ambient pre-cure treatment was not necessary. Instead, the circuits with the encapsulating layer were permitted to stand in air for a period of time ranging from 2-12 hours. This treatment caused evaporation of the solvent while keeping the encapsulant in an essentially uncured state for application of the cover coating. (The encapsulant takes approximately seven days to cure at room temperature.) That is, for the purposes of this invention, the "essentially uncured state" of the encapsulant is one where the material remains in the form of a paste and has not yet reached a tack-free state.

In accordance with the next step, a solvent resistant cover coating, 19, which cures by heat or reaction with moisture, was applied over the uncured encapsulant. In one embodiment of the invention, the cover coat comprised polyurethane which cures by reaction with moisture. The particular material employed was a solvent based polyether urethane which is sold by Conap, Inc. under the trademark Conathane CE-1164. This material was applied by flow coating to a thickness of approximately 40 mils. Preferably, the thickness of the layer as applied is within the range 30-55 mils to insure adequate protection after solvent evaporation while permitting both layers to cure in the succeeding steps.

In accordance with a second embodiment, the cover coating, 19, was an epoxy resin which cures by heating. Such resins are basically a mixture of bisphenol A and epichlorhydrin. A material found to be particularly effective was an anhydride cured bisphenol A epoxy resin which is sold by the Hysol Division of the Dexter Corporation under the designation Hysol EO1017.

The epoxy was applied over the encapsulant by screen printing to a thickness of approximately 30 mils. A preferred range is 20-40 mils to insure adequate protection while permitting both layers to cure in accordance with the succeeding steps.

In the next step, the layers were co-cured. A curing cycle was therefore chosen to harden both layers to achieve the necessary protection without the cover coating impeding the curing of the underlying encapsulant layer. Preferably, a curing cycle should be chosen which permits the cover coat to completely cure within two hours of complete curing of the encapsulant. It was found that if the cover coat cures too soon before the encapsulant, the curing of the encapsulant will be inhibited. If the cover coat cures too long after the encapsulant, it is likely that adhesion will be diminished. In the case of the polyurethane cover coating, it was found that the two layers could be co-cured by keeping the circuit at room temperature (25° C.) for sixteen hours (which also permits evaporation of the solvent in the polyurethane coating) followed by heating at approximately 120 degrees C. for six hours, both steps in an air atmosphere with a relative humidity of 40% measured at 25 degrees C. In such a cycle, the RTV and cover coating appeared to cure in a normal manner. A suitable range appears to be 6-16 hours at 25 degrees C. followed by heating at 80-120 degrees C. for 6-12 hours. The relative humidity during the curing cycle should be maintained at 35-60% as measured at 25 degrees C. In the case of an epoxy cover coating, a particularly effective curing cycle is heating for three hours at 100 degrees C. followed by four hours at 120 degrees C. in an air environment with a relative humidity of 40% when measured at 25 degrees C. A preferred range appears to be heating at 90-110 degrees C. for 2-4 hours followed by heating at 120-130 degrees C. for 4-6 hours in an atmosphere with a relative humidity of 35-60% when measured at 25 degrees C.

Tests were performed by depositing the combination of RTV encapsulant and polyurethane on a glass slide in accordance with the above process. If the polyurethane is deposited over a cured encapsulant, the cover coat easily separates from the encapsulant when a slight lifting force is applied to the interface or when the layer is subject to thermal cycling. When the polyurethane was applied to the uncured encapsulant in accordance with the invention, the layers did not separate even with a strong lifting force and the adhesion appeared uniform over the whole sample.

The combination of RTV encapsulant and epoxy was applied over several triple track resistor test circuits in accordance with the invention. The adhesion between the two layers was as good as that obtained between the polyurethane and encapsulant. The leakage current was measured to determine the extent of moisture protection afforded by the dual layer. It was discovered that the dual layer improved moisture protection over the encapsulant alone for the first 1,000 hours. Hybrid integrated circuits covered with the encapsulant and epoxy in accordance with the invention were immersed in solvents such as trichlorethylene, freon TE (trademark of DuPont) and perchlorethylene, and it was discovered that the cover coat protected the circuit components from the adverse effects associated with the use of the encapsulant alone.

Although polyurethane and epoxy have been specifically described for use as the cover coat, the invention may be applicable to other solvent resistant polymer materials as long as they can be co-cured with the encapsulant.

Various additional modifications will become apparent to those skilled in the art. All such variations which basically rely on the teachings through which the invention has advanced the art are properly considered within the spirit and scope of the invention.

What is claimed is:

1. A method of encapsulating circuit components comprising the steps of:
    applying over said components a first layer comprising a room temprature vulcanizing silicone rubber which cures by reaction with moisture;
    while said first layer is in a substantially uncured state, applying over said first layer a second layer comprising a polymer selected from the group consisting of polyurethane and epoxy; and
    exposing the resulting structure to moisture at a temperature and for a time sufficient to cure both of said layers so that the two layers adhere strongly to one another.

2. The method according to claim 1 wherein said first layer is a dispersion of a room temperature vulcanizing silicone rubber annd an organic solvent.

3. The method according to claim 2 further comprising the step of evaporating the solvent without substantially curing said first layer prior to applying said second layer.

4. The method according to claim 3 wherein the solvent is evaporated by treating said first layer with a flowing dry ambient with a relative humidity of no greater than 5 percent.

5. The method according to claim 4 wherein the solvent is evaporated by permitting the encapsulated components to stand in air for 2-12 hours.

6. The method according to claim 1 wherein the second layer is polyurethane with a thickness as applied within the range 30-55 mils.

7. The method according to claim 6 wherein the layers are cured by keeping the structure at room temperature for 6-16 hours followed by heating at 80-120 degrees C for 6-12 hours in an atmosphere with a relative humidity of 35-60%.

8. The method according to claim 1 wherein the second layer is an epoxy with a thickness as applied within the range 20-40 mils.

9. The method according to claim 8 wherein the layers are cured by heating the structure for 2-4 hours at 90-110 degrees C. followed by heating at 120-130 degrees C. for 4-6 hours in an atmosphere with a relative humidity of 35-60 percent.

10. A method of encapsulating a circuit formed on an insulating substrate comprising the steps of:
  applying by flowcoating over said circuit a first layer comprising a dispersion of a room temperature vulcanizing silicone rubber encapsulant and an organic solvent to a thickness within the range 30-55 mils, which layer cures by reaction with moisture;
  evaporating the solvent without substantially curing said first layer;
  while said first layer is in a substantially uncured state, applying over said first layer a second layer comprising a material selected from the group consisting of polyurethane and epoxy; and
  exposing the resulting structure to moisture for a time and at a temperatue sufficient to completely cure both of said layers so that the two layers adhere strongly to one another.

11. The method according to claim 10 wherein the second layer comprises polyurethane with a thickness within the range 30-55 mils and the layers are cured by keeping the circuit at room temperature for 6-16 hours followed by heating at 80-120 degrees C. for 6-12 hours, in an atmosphere with a relative humidity of 35-60%.

12. The method according to claim 10 wherein the second layer comprises an epoxy with athicknss within the range 20-40 mils, and the layers are cured by heating the circuit for 2-4 hours at 90-110 degrees C. followed by heating at 120-130 degrees C. for 4-6 hours in an atmosphere with a relative humidity of 35-60 percent.

13. A method of encapsulating a circuit formed on an insulating substrate comprising the steps of:
  applying by flowcoating over said circuit a first layer comprising a dispersion of a room temperature vulcanizing silicone rubber and an organic solvent to a thickness within the range 30-55 mils, which layer cures by reacton with moisture;
  keeping said circuit in air for 2-12 hours in order to evaporate said solvent without substantially curing said first layer;
  while said first layer is in a substantially uncured state, applying by screen printing over said first layer a second layer comprising an epoxy to a thickness within the range 20-40 mils; and
  heating the circuit in air for 2-4 hours at 90-110 degrees C. followed by heating at 120-130 degrees C. for 4-6 hours in an atmosphere with a relative humidity of 35-60 percent so as to cure both of said layers and establish strong adhesion between the layers.

* * * * *